(12) United States Patent
Liang (10) Patent No.: US 12,203,312 B2
(45) Date of Patent: Jan. 21, 2025

(54) SYSTEM, METHOD, AND DEVICE FOR MONITORING CLOSED STATE OF COVER OF EXPOSURE MACHINE, MEDIUM, AND EQUIPMENT

(71) Applicant: CHANGXIN MEMORY TECHNOLOGIES, INC., Hefei (CN)

(72) Inventor: Xueyu Liang, Hefei (CN)

(73) Assignee: CHANGXIN MEMORY TECHNOLOGIES, INC., Hefei (CN)

( * ) Notice: Subject to any disclaimer, the term of this patent is extended or adjusted under 35 U.S.C. 154(b) by 449 days.

(21) Appl. No.: 17/580,754

(22) Filed: Jan. 21, 2022

(65) Prior Publication Data

US 2022/0136304 A1 May 5, 2022

Related U.S. Application Data

(63) Continuation of application No. PCT/CN2021/105800, filed on Jul. 12, 2021.

(30) Foreign Application Priority Data

Sep. 11, 2020 (CN) .......................... 202010956265.4

(51) Int. Cl.
| | |
|---|---|
| *G01D 5/20* | (2006.01) |
| *E05F 15/611* | (2015.01) |
| *G01D 5/347* | (2006.01) |
| *G08B 21/18* | (2006.01) |

(52) U.S. Cl.
CPC .............. *E05F 15/611* (2015.01); *G01D 5/20* (2013.01); *G01D 5/3473* (2013.01); *G08B 21/182* (2013.01); *E05Y 2201/434* (2013.01); *E05Y 2400/354* (2013.01); *E05Y 2400/44* (2013.01);
(Continued)

(58) Field of Classification Search
CPC ........ B65D 43/26; E05F 15/611; E05C 17/56; E05Y 2201/434; E05Y 2400/354; E05Y 2400/44; E05Y 2400/814; E05Y 2400/822; E05Y 2999/00; G01B 11/26; G01D 5/20;
(Continued)

(56) References Cited

U.S. PATENT DOCUMENTS

| | | | |
|---|---|---|---|
| 6,590,357 B2 * | 7/2003 | Okamoto | ............. G05B 19/042 318/467 |
| 9,224,283 B2 | 12/2015 | Kaneko | |

(Continued)

FOREIGN PATENT DOCUMENTS

| | | |
|---|---|---|
| CN | 201264082 Y | 7/2009 |
| CN | 204576192 U | 8/2015 |

(Continued)

*Primary Examiner* — Kidest Bahta
(74) *Attorney, Agent, or Firm* — Kilpatrick Townsend & Stockton LLP (57) ABSTRACT

A system for monitoring a closed state of a cover of an exposure machine includes a servo motor, a photoelectric encoder, and a controller. A shaft of the servo motor is coaxially fixedly connected to a shaft of the cover. The photoelectric encoder is provided on the servo motor, and is configured to detect an angle of rotation of the shaft of the servo motor. The controller is connected to the servo motor and the photoelectric encoder, and is configured to control rotation of the shaft of the servo motor and determine whether the cover is in the closed state according to the angle.

20 Claims, 10 Drawing Sheets

(52) U.S. Cl.
CPC ... *E05Y 2400/814* (2013.01); *E05Y 2400/822* (2013.01); *E05Y 2999/00* (2024.05)

(58) Field of Classification Search
CPC . G01D 5/3473; G03F 7/70808; G03F 7/7085; G08B 21/182; Y02P 90/02
See application file for complete search history.

(56) References Cited

U.S. PATENT DOCUMENTS

| | | | | |
|---|---|---|---|---|
| 2010/0115853 | A1* | 5/2010 | Gebhart | H02P 6/28 49/506 |
| 2010/0148979 | A1* | 6/2010 | Lee | H01L 21/68742 340/686.1 |
| 2015/0012124 | A1 | 1/2015 | Hiroki | |
| 2017/0284146 | A1* | 10/2017 | Maki | B23Q 11/0891 |

FOREIGN PATENT DOCUMENTS

| | | | |
|---|---|---|---|
| CN | 206539186 U | * | 10/2017 |
| CN | 207673242 U | | 7/2018 |
| CN | 108843205 A | | 11/2018 |
| CN | 209261449 U | | 8/2019 |
| CN | 111308863 A | * | 6/2020 |
| CN | 211388712 U | | 9/2020 |
| JP | H11135408 A | | 5/1999 |

* cited by examiner

FIG. 7

SYSTEM, METHOD, AND DEVICE FOR MONITORING CLOSED STATE OF COVER OF EXPOSURE MACHINE, MEDIUM, AND EQUIPMENT

CROSS-REFERENCE TO RELATED APPLICATION

This is a continuation application of International Patent Application No. PCT/CN2021/105800, filed on Jul. 12, 2021, which claims benefit of priority to Chinese Application No. 202010956265.4, filed on Sep. 11, 2020 and titled "SYSTEM, METHOD, AND DEVICE FOR MONITORING A CLOSED STATE OF COVER OF EXPOSURE MACHINE, MEDIUM, AND EQUIPMENT". The entire contents of International Patent Application No. PCT/CN2021/105800 and Chinese Application No. 202010956265.4 are incorporated herein by reference in their entireties.

TECHNICAL FIELD

The present disclosure relates to the field of semiconductor technology, and more particularly, to a system, method, and device for monitoring a closed state of a cover of an exposure machine, a computer readable storage medium, and electronic equipment.

BACKGROUND

A cover outside an exposure machine may isolate an internal environment of the machine from an external environment, preventing particulate matter from entering the machine from the external environment to affect a product yield. At the same time, there are many circuit boards and circuit breakers under some covers. A cover that cannot be closed completely may pose a potential safety threat.

During production by the machine, with impact of an air flow and machine vibration, a lock of the cover will become loose, and then the cover will be opened. Impacted by a factor of structural design of the cover, it is difficult to determine whether the cover is closed completely, that is, whether it is in the closed state.

There is a pressing need for detecting, in a simple and convenient way, whether a cover is closed completely.

SUMMARY

Embodiments of the present disclosure are to provide a system, method, and device for monitoring a closed state of a cover of an exposure machine, a computer readable storage medium, and electronic equipment, at least capable of improving a product yield to some extent.

Other characteristics and advantages of the present disclosure will show through elaboration below, or learned partly through practice of the present disclosure.

According to a first aspect of embodiments of the present disclosure, there is provided a system for monitoring a closed state of a cover of an exposure machine. The system includes a servo motor, a photoelectric encoder, and a controller. A shaft of the servo motor is coaxially fixedly connected to a shaft of the cover. The photoelectric encoder is provided on the servo motor, and is configured to detect an angle of rotation of the shaft of the servo motor. The controller is connected to the servo motor and the photoelectric encoder, and is configured to control rotation of the shaft of the servo motor and determine whether the cover is in the closed state according to the angle.

According to a second aspect of embodiments of the present disclosure, there is provided a method for monitoring a closed state of a cover of an exposure machine. A shaft of the cover of the exposure machine is coaxially fixedly connected to a shaft of a servo motor. The servo motor is provided with a photoelectric encoder configured to detect an angle of rotation of the shaft of the servo motor. The method includes: generating a servo motor control signal to control the servo motor to rotate; acquiring the angle of rotation of the shaft of the servo motor detected by the photoelectric encoder; and determining whether the cover is in the closed state according to the angle.

According to a third aspect of embodiments of the present disclosure, there is provided a device for monitoring a closed state of a cover of an exposure machine. A shaft of the cover of the exposure machine being coaxially fixedly connected to a shaft of a servo motor. The servo motor is provided with a photoelectric encoder configured to detect an angle of rotation of the shaft of the servo motor. The device includes a controlling unit, an acquiring unit, and a determining unit. The controlling unit is configured to generate a servo motor control signal to control the servo motor to rotate. The acquiring unit is configured to acquire the angle of rotation of the shaft of the servo motor detected by the photoelectric encoder. The determining unit is configured to determine whether the cover is in the closed state according to the angle.

According to a fourth aspect of embodiments of the present disclosure, there is provided a computer readable storage medium, having stored thereon a computer program which, when executed by a processor, implements the method of the second aspect according to embodiments here.

According to a fifth aspect of embodiments of the present disclosure, there is provided electronic equipment, including: one or more processors; and a storage device configured to store one or more programs which, when executed by the one or more processors, allow the one or more processors to implement the method of the second aspect according to embodiments here.

It should be understood that the general description above and the elaboration below are illustrative and explanatory only, and do not limit the present disclosure.

BRIEF DESCRIPTION OF THE DRAWINGS

The drawings, which are incorporated in and constitute a part of this specification, illustrate embodiments consistent with the present disclosure and, together with the description, serve to explain the principles of the present disclosure. It is clear that the drawings described below refer merely to some embodiments of the present disclosure. A person having ordinary skill in the art may acquire other drawings according to the drawings here without creative effort.

DETAILED DESCRIPTION

Illustrative embodiments will be described more comprehensively with reference to the drawings. However, the illustrative embodiments can be implemented in many forms, and should not be construed as being limited to examples illustrated here. Instead, by providing these embodiments, the present disclosure may become more comprehensive and complete, and concept of the illustrative embodiments may be delivered comprehensively to a skilled person in the art. Same reference signs in the drawings represent the same or similar structures, so that description of them will not be repeated.

Although relative terms, such as "upper" and "lower", are used in the specification to describe the relation between one component and another illustrated, these terms are used in the specification merely for convenience, such as according to the direction of the example in the drawings. It may be understood that if the illustrated device is flipped to make it upside down, then the described "upper" component will become a "lower" component. Other relative terms, such as "high", "low", "top", "bottom", "left", and "right", also have similar meanings. When a certain structure is "on" another structure, it may mean that the certain structure is integrally formed on the other structure, or the certain structure is "directly" provided on the other structure, or the certain structure is "indirectly" provided on the other structure through yet another structure.

Terms "one", "a", and "the" are used to indicate that there is one or more elements/component distinctions/etc. Terms "include/comprise" and "have/has" are used to indicate open inclusion, and refer to that there may further be other elements/components, etc., in addition to the listed elements/components, etc.

In related art, a cover of an exposure machine is opened and closed manually, with cumbersome operation steps. Specifically, to close the cover, a lock of the cover has to be locked manually using an internal hexagonal wrench. If the cover is not closed completely, one has to look for a hexagonal wrench to relock the cover. If the hexagonal wrench is not at hand, the cover cannot be locked quickly.

In addition, it is not possible to monitor or detect whether the cover is in the closed state. When the cover is not closed completely, external particles will enter the machine, impacting the product yield.

In view of this, the present disclosure provides a system, method, and device for monitoring a closed state of a cover of an exposure machine, a computer readable storage medium, and electronic equipment, capable of opening and closing the cover automatically and improving the product yield.

Figure 1:
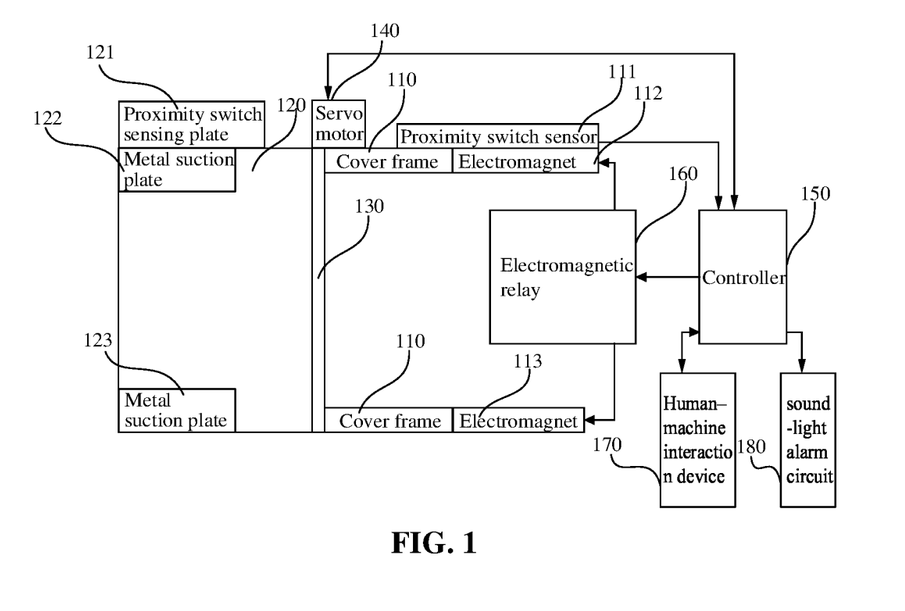
FIG. 1 is a diagram of a system for monitoring a closed state of a cover of an exposure machine according to an embodiment of the present disclosure.

As shown in FIG. 1, embodiments of the present disclosure provide a system for monitoring a closed state of a cover of an exposure machine. The system includes a servo motor 140, a photoelectric encoder, and a controller. A shaft of the servo motor 140 is coaxially fixedly connected to a shaft 130 of the cover 120. The photoelectric encoder (not shown) is provided on the servo motor, and is configured to detect an angle of rotation of the shaft of the servo motor. The controller 150 is connected to the servo motor and the photoelectric encoder, and is configured to control rotation of the shaft of the servo motor and determine whether the cover 120 is in the closed state according to the angle.

The controller may drive, through a dedicated motor driving chip, the servo motor to rotate clockwise or counterclockwise. The motor driving chip not only may generate a servo motor control signal according to the controller and send the servo motor control signal to drive rotation of the shaft of the servo motor, but also may convey a feedback signal detected inside the servo motor to the controller, forming closed-loop control. The controller and the dedicated motor driving chip jointly control the cover. Here, the controller may be a micro-processor.

The servo motor may compute the angle of rotation of the shaft of the servo motor according to the photoelectric encoder, and record the angle of rotation corresponding to the servo motor through a storage circuit, implementing measurement of the angle of rotation of the cover, thereby monitoring a closed state of the cover.

When the photoelectric encoder works, light may be projected onto a code disk of the photoelectric encoder. The code disk may rotate with a moving object. Light passing through a bright area passes through a slit and is then received by a photosensitive element of the photoelectric encoder. Photosensitive elements may be arranged in one-to-one correspondence with code tracks. Photosensitive elements in a bright area and a dark area may output signals "1" and "0", respectively. When the code disk of the photoelectric encoder rotates to a distinct location, the combination of signals output by the photosensitive elements may be a digital quantity with a certain pattern, which represents the angular displacement of a code disk shaft.

The initial angle value of rotation of the shaft of the servo motor may be set to 0. It may be set that the measured angle increases accordingly when the shaft of the servo motor rotates in one direction, and decreases accordingly when there is a change in the direction of rotation. By default, when the cover is closed completely, the angle of rotation of the shaft of the servo motor is 0. The angle of rotation of the shaft of the servo motor increases equally with the increase of the angle between the cover and a cover frame 110.

By fixing the shaft of the servo motor to the shaft of the cover, the cover may rotate with the servo motor. The photoelectric encoder built in the servo motor may compute the angle of rotation of the cover. Through the angle of rotation, the degree that the cover opens may be computed indirectly, thereby determining whether the cover is closed completely.

The servo motor may drive rotation of a mechanical part and control the speed of rotation, with high location precision. Specifically, the servo motor may convert a voltage signal into a torque and a speed of rotation to drive the shaft of the cover. The speed of rotation of a rotor of the servo motor may be controlled by an input signal and can respond quickly. In an automatic control system, a servo motor may be used as an actuating element, which may convert a received electrical signal into angular displacement or angular velocity output on the shaft of the servo motor. The servo motor does not spin when the signal voltage is zero, allowing the cover to stay in a static state after the cover is opened or closed.

The servo motor may perform positioning mainly by pulses. When receiving 1 pulse, the servo motor will rotate by an angle corresponding to 1 pulse, thereby implementing displacement. The servo motor per se is capable of pulse sending. Therefore, the servo motor will send out a number of pulses corresponding to each angle by which the servo motor rotates, which echoes, i.e., forms a closed loop with, pulses received by the servo motor. In this way, the system may know the number of pulses sent to the servo motor and the number of pulses recovered, so as to control the rotation of the motor precisely, implementing precise positioning, such as with a positioning precision of 0.001 mm.

As shown in FIG. 1, the system may further include a sensing plate of a proximity switch and a sensor of the proximity switch. The sensing plate 121 of the proximity switch may be provided atop a side of the cover away from the shaft of the cover. The sensor 111 of the proximity switch may be in signal connection with the controller. The sensor of the proximity switch may be provided atop a side of a cover frame of the exposure machine, away from the shaft of the cover, corresponding to the sensing plate of the proximity switch. The sensor of the proximity switch may be configured to, in response to the cover being closed and the sensing plate of the proximity switch approaching the sensor of the proximity switch, generate a proximity signal and send the proximity signal to the controller.

Here, the proximity switch may be an inductive proximity switch. A sensor of the inductive proximity switch installed on the cover frame of the machine may measure the distance between the cover and the cover frame. The distance and the angle of rotation of the shaft of the servo motor computed by the servo motor via the photoelectric encoder may complement each other to prevent the cover and the servo motor from being damaged due to the fact that the servo motor continues to drive rotation of the cover after the cover has been closed completely, thereby better protecting the device.

When being 50 mm away from the cover frame, the sensing plate of the proximity switch may enter the working range of the sensor of the proximity switch. At this time, the controller may send a deceleration command. The servo motor may start to decelerate, ultimately allowing the cover to approach the cover frame of the machine at a slow speed, smoothing the closing action.

The output signal of the sensor of the proximity switch may be amplified, stabilized and filtered by a signal conditioning circuit, and Analog/Digital (A/D) converted to finally become a digital signal recognizable by the controller.

The sensor of an inductive proximity switch may consist of three parts, i.e., an oscillator, a switch circuit, and an amplification output circuit. The oscillator may generate an alternating magnetic field. When a metal target such as the sensing plate of the proximity switch approaches the magnetic field and reach an induction distance, an eddy current may be generated in the metal target, leading to attenuation of the metal oscillator and even oscillation stop. The change in oscillation and oscillation stop of the oscillator may be processed by a subsequent amplification output circuit and converted into a switch signal, which may be ultimately transmitted to the controller, implementing non-contact detection.

The system may further include a metal suction plate and an electromagnet. The metal suction plate 123 may be provided below a side of the cover away from the shaft of the cover. The electromagnet 113 may be in signal connection with the controller. The electromagnet may be provided below a side of a cover frame of the exposure machine, away from the shaft of the cover, corresponding to the metal suction plate 123. The electromagnet may be configured to engage the metal suction plate according to an electromagnet control signal sent by the controller.

In addition, the metal suction plate 122 and the electromagnet 112 may be provided in pairs below the side of the cover away from the shaft of the cover and the side of the cover frame away from the shaft of the cover.

Figure 2:
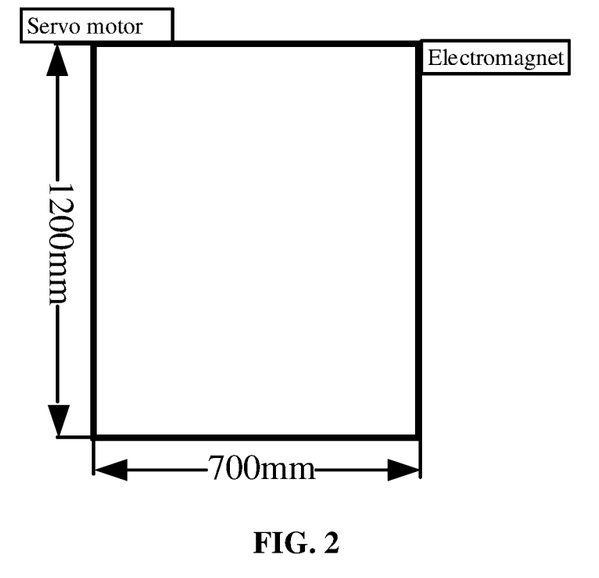
FIG. 2 is a diagram of a cover according to an embodiment of the present disclosure.

In embodiments of the present disclosure, as shown in FIG. 2, the cover may be 700 mm in width. Then, an arm of force of the electromagnet may be 700 mm. An arm of force of the servo motor may be 5 mm In this way, when the cover is close to the electromagnet, it is more effortless to engage the cover using the electromagnet.

Since the controller outputs a signal of a voltage of 5 v and the electromagnet works at a voltage of 220 v, connection or disconnection of a loop where the electromagnet is located may have to be controlled using an electromagnetic relay, to control the presence or absence of the suction force of the electromagnet.

As shown in FIG. 1, the system may further include an electromagnetic relay 160. The electromagnetic relay may be connected between the controller 150 and the electromagnet 113, and may be configured to control, according to the electromagnet control signal sent by the controller, connection or disconnection of a path where the electromagnetic relay is located.

When a pin controlling the electromagnet on the electromagnetic relay outputs a low level, the electromagnet does not work, and an armature resets. To engage the metal suction plate on the cover, the pin controlling the electromagnet on the electromagnetic relay may output a high level, the electromagnet may control conduction of the loop, and the electromagnet may generate a magnetic force to firmly engage the cover.

A relay is an electrical control device, which may control interaction between a system and a controlled system. A relay is generally used in an automatic control circuit. A relay is actually an "automatic switch" that controls operation of a large current using a small current. A relay may serve for automatic regulation, safety protection, or serve as a conversion circuit, etc., in a circuit. An electromagnetic relay generally consists of an iron core, a coil, an armature, a contact reed, etc. Provided that a certain voltage is applied at both ends of the coil, a certain current will flow through the coil, generating an electromagnetic effect. Attracted by an electromagnetic force, the armature will and be attracted to the iron core overcoming the pull of a return spring, driving a moving contact of the armature to engage a normally open contact. When the coil is powered off, the engaging electromagnetic suction disappears accordingly, and the armature will return to the original location under the reaction force of the spring, releasing the moving contact from the original normally closed contact. The engagement and release turn on and off the circuit. A static contact remaining in a disconnected state when the coil of the relay is not powered may be referred to as "a normally open contact". A static contact remaining in a connected state when the coil of the relay is not powered may be referred to as "a normally closed contact". A relay generally has two circuits, namely a low-voltage control circuit and a high-voltage working circuit. In embodiments of the present disclosure, the low-voltage control circuit may be connected to the controller. The high-voltage working circuit may be connected to the electromagnet.

As shown in FIG. 1, the system may further include a human-machine interaction device 170. The human-machine interaction device may be in signal connection with the controller. The human-machine interaction device may be configured to display an open state of the cover or a closed state of the cover according to a state signal sent by the controller, and to make, through a manual operation, the controller generate a servo motor control signal to control opening or closing of the cover.

Figure 3A:
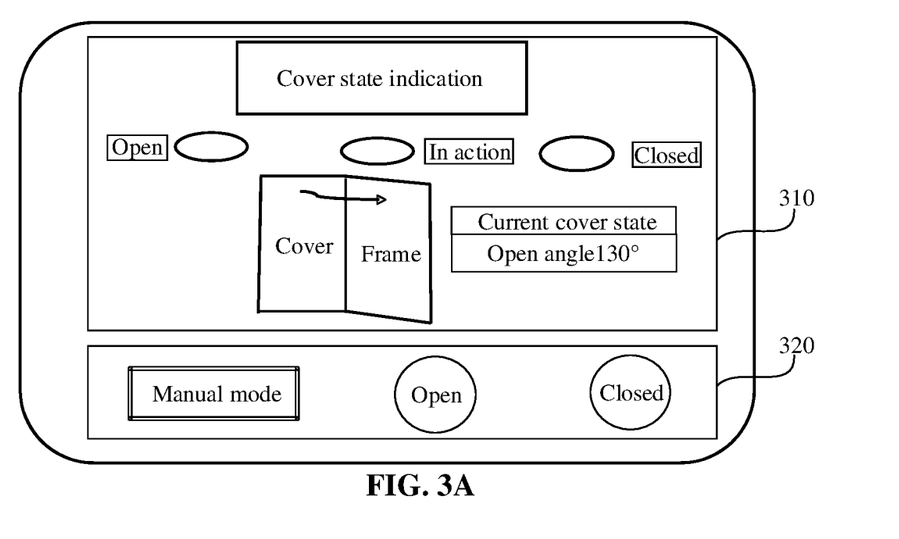
FIG. 3A is a diagram of a human-machine interaction device according to an embodiment of the present disclosure.

As shown in FIG. 3A, the human-machine interaction device may include a display unit 310 and a keyboard 320.

The display unit 310 may display the current working state of the cover in real time. When the distance between the cover and the cover frame is 0 mm, the cover is in a closed state, and a cover closed state indicator light will be turned on. When the distance between the cover and the cover frame is greater than 0 mm, an open indicator light will be turned on, and any other indicator light will go out. If the motor is rotating, just an in-action indicator light will be turned on. The real-time state of the cover of the machine may be known in time through a cover current state display function of the display unit.

A key in the keyboard 320 may be connected to a corresponding input pin of the controller of the human-machine interaction device. When the key is disconnected, the pin corresponding to the key may have a voltage of 5V. After the key is pressed down, the pin corresponding to the key may have a voltage of 0. It may be determined whether a key is being pressed down according to a change in the voltage of a pin, and then a key function corresponding to software programming setting may be executed.

The human-machine interaction device may be a touch screen. A driving decoding chip of the touch screen may allow the touch screen to display information sent by the controller, and convert an input signal sensed by the touch screen into an output signal to drive an actuating element to implement a function needed by the device.

The display unit driven by the controller may display the angle at which the cover is open, as well as the distance between the frame of the machine and the cover as detected by the sensor of the proximity switch, allowing the current situation of the cover to be seen more intuitively. The cover may be opened and closed manually using keys and a key circuit without a torque wrench.

The servo motor will compute the angle at which the cover is being open according to the angle of rotation, and display the angle at which the cover is being open on a display. In a manual mode, the cover may be opened or closed manually by pressing down a key. The cover may be opened or closed by pressing down a corresponding key.

As shown in FIG. 1, the system may further include a sound-light alarm circuit 180. The sound-light alarm circuit may be connected to the controller. The sound-light alarm circuit may be configured to, in response to the cover staying in a not-completely-closed state for a preset first period of time, give a sound-light alarm according to an alarm signal generated by the controller. In the not-completely-closed state, a distance between the cover and the cover frame may be greater than a first distance preset.

The sound-light alarm circuit may prompt an operator to confirm the current cover state and close the cover in time when the cover stays open for more than 2 h. When the angle between the cover and the cover frame is greater than 2 degrees and the cover is not closed for more than 2 h, the electromagnet will close the cover automatically. Even if the cover is not closed manually, the device may close the cover automatically. With a strong electromagnet engaging force, the cover is prevented from getting loose.

Figure 3B:
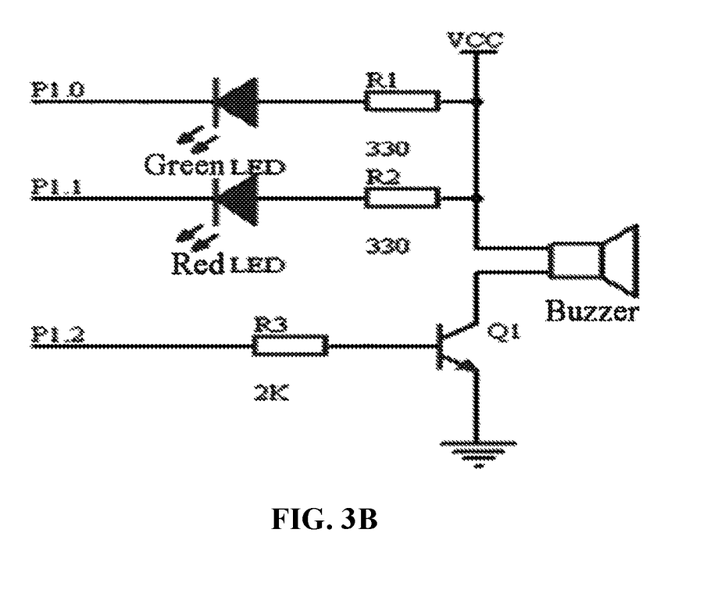
FIG. 3B is a diagram of a sound-light alarm circuit according to an embodiment of the present disclosure.

In a sound-light alarm circuit as shown in FIG. 3B, when the controller detects that the cover is in the closed state, an input and output interface P1.0 may output a low level, a green LED light may be turned on, an input and output interface P1.2 may output a low level, a triode may be cut off, and a buzzer may not work. When the controller detects that the cover is not in the closed state, a pin of the input and output interface P1.1 may output a low level, a red LED indicator light may be turned on, the input and output interface P1.2 may output a high level, the triode Q1 connected to the buzzer may be turned on, and the buzzer may work.

Figure 4:
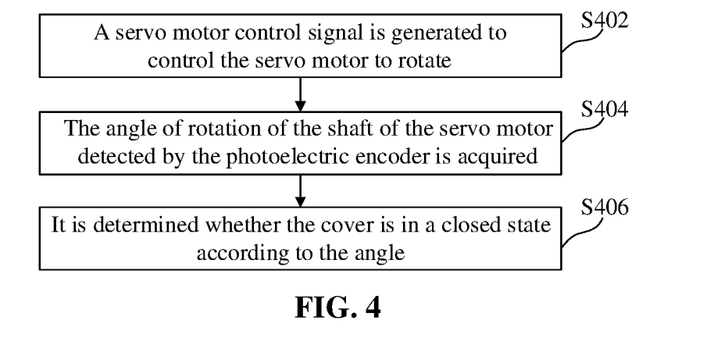
FIG. 4 is a flowchart of a method for monitoring a closed state of a cover of an exposure machine according to an embodiment of the present disclosure.

FIG. 4 is a flowchart of a method for monitoring a closed state of a cover of an exposure machine according to an embodiment of the present disclosure. The method provided in embodiments of the present disclosure may be implemented by any electronic equipment having computer processing capability, such as terminal equipment and/or a server. In embodiments of the present disclosure, a shaft of the cover of the exposure machine is coaxially fixedly connected to a shaft of a servo motor. The servo motor is provided with a photoelectric encoder configured to detect an angle of rotation of the shaft of the servo motor. As shown in FIG. 4, illustrative embodiments of the present disclosure provide a method for monitoring a closed state of a cover of an exposure machine. The method includes an operation as follows.

At S402, a servo motor control signal is generated to control the servo motor to rotate.

At S404, the angle of rotation of the shaft of the servo motor detected by the photoelectric encoder is acquired.

At S406, it is determined whether the cover is in the closed state according to the angle.

In embodiments of the present disclosure, a sensor of a proximity switch may be provided on a cover frame of the exposure machine. A sensing plate of the proximity switch may be provided on the cover, corresponding to the sensor of the proximity switch. The method may further include an operation as follows. A first control signal may be generated to control deceleration of the servo motor when a proximity switch signal, generated by the sensor of the proximity switch when sensing proximity to the sensing plate of the proximity switch, indicates a distance between the cover and the cover frame less than a second distance preset. A second control signal may be generated to control the servo motor to stop working when the proximity switch signal, generated by the sensor of the proximity switch when sensing proximity to the sensing plate of the proximity switch, indicates a distance between the cover and the cover frame equal to 0. Here, the second distance may be 50 mm In embodiments of the present disclosure, an electromagnet may be provided on the cover frame of the exposure machine. A metal suction plate may be provided on the cover, corresponding to the electromagnet. The method may further include an operation as follows. An electromagnet control signal may be generated to control the electromagnet to engage the metal suction plate when the proximity switch signal, generated by the sensor of the proximity switch when sensing proximity to the sensing plate of the proximity switch, indicates a distance between the cover and the cover frame less than a first distance. Here, the first distance may be 50 mm.

In embodiments of the present disclosure, the controller may be connected to a human-machine interaction device. The method may further include an operation as follows. A state signal may be sent to the human-machine interaction device to display an open state of the cover or a closed state of the cover. A human-machine interaction signal collected by the human-machine interaction device may be collected. A servo motor control signal may be generated according to the human-machine interaction signal to control opening or closing of the cover.

In embodiments of the present disclosure, the controller may be connected to a sound-light alarm circuit. The method may further include an operation as follows. When the cover stays in a not-completely-closed state for a preset first period of time, an alarm signal may be generated and sent to the sound-light alarm circuit to give a sound-light alarm. In the not-completely-closed state, a distance between the cover and the cover frame may be greater than a first distance preset.

An arm of force of the servo motor is about 5 mm, which has limited torque. Therefore, when the distance between the cover and the frame is within a range of 50 mm, the electromagnet may serve as a primary way of closing the cover due to advantages in terms of suction and for being located at the edge of a lever, and may engage the cover automatically if it is detected within a certain time that the cover is not closed.

Figure 5A:
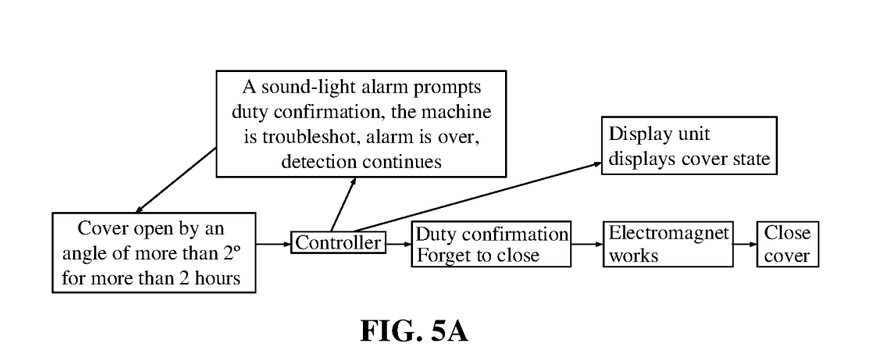
FIG. 5A is a diagram of a process of monitoring a closed state of a cover of an exposure machine according to an embodiment of the present disclosure.

Here, the first period of time may be 2 h. The first distance may be 50 mm or 25 mm. As shown in FIG. 5A, when the distance between the cover and the cover frame is greater than 25 mm, the cover plate may be open by an angle of more than 2 degrees, and a timer in the controller may start to work. When timing has been performed for more than 2 h, the sound-light alarm circuit will be driven to prompt a staff member. When confirming that the machine is troubleshooting, the staff member may restore the device to the initial 0 state through a reset key to restart the timer. If the cover is not closed after the troubleshooting, the device may drive the servo motor to rotate and the electromagnet to work to close the cover.

Figure 5B:
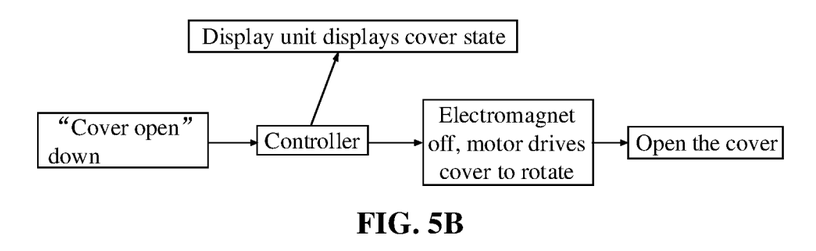
FIG. 5B is a diagram of a process of monitoring a closed state of a cover of an exposure machine according to an embodiment of the present disclosure.
Figure 5C:
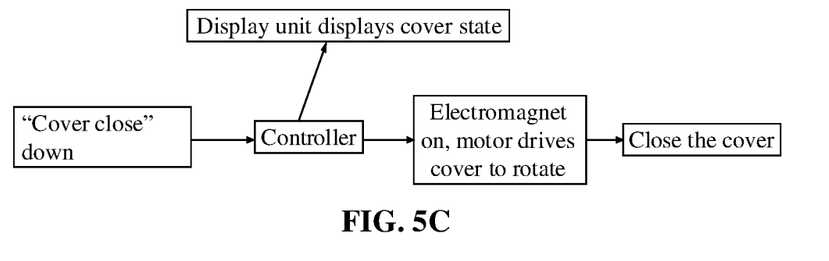
FIG. 5C is a diagram of a process of monitoring a closed state of a cover of an exposure machine according to an embodiment of the present disclosure.

As shown in FIG. 5B and FIG. 5C, after an open key and a close key have been pressed down, the controller may control the servo motor and the electromagnet to open and close the cover.

In the method for monitoring a closed state of a cover of an exposure machine provided in embodiments of the present disclosure, the cover is opened or closed using a servo motor coaxially rotating with the cover. An angle of rotation of the shaft of the servo motor is measured using a photoelectric encoder, allowing to detect whether the cover is in the closed state, thereby improving the product yield.

Figure 6:
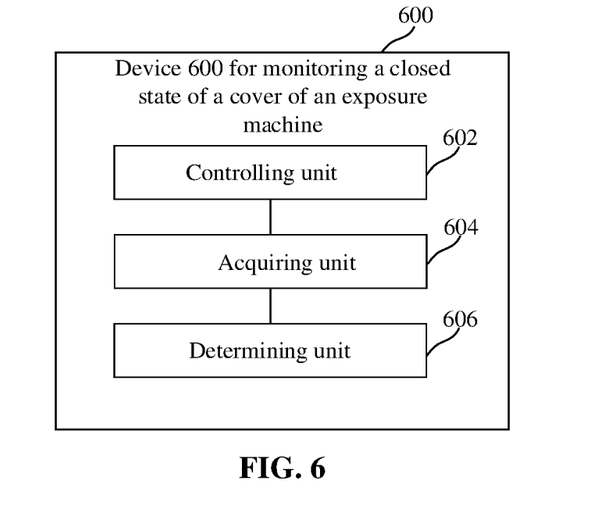
FIG. 6 is a block diagram of a device for monitoring a closed state of a cover of an exposure machine according to an embodiment of the present disclosure.

Embodiments of the device of the present disclosure are introduced below. The device may be configured to implement the method for monitoring a closed state of a cover of an exposure machine of the present disclosure. In embodiments of the present disclosure, a shaft of the cover of the exposure machine is coaxially fixedly connected to a shaft of a servo motor. The servo motor is provided with a photoelectric encoder configured to detect an angle of rotation of the shaft of the servo motor. As shown in FIG. 6, a device 600 for monitoring a closed state of a cover of an exposure machine according to embodiments of the present disclosure may include a controlling unit, an acquiring unit, and a determining unit.

The controlling unit 602 is configured to generate a servo motor control signal to control the servo motor to rotate.

The acquiring unit 604 is configured to acquire the angle of rotation of the shaft of the servo motor detected by the photoelectric encoder.

The determining unit 606 is configured to determine whether the cover is in the closed state according to the angle.

Functional modules of the device for monitoring a closed state of a cover of an exposure machine according to illustrative embodiments of the present disclosure correspond to the steps of illustrative embodiments of the method for monitoring a closed state of a cover of an exposure machine. Therefore, please refer to embodiments of the method for monitoring a closed state of a cover of an exposure machine of the present disclosure for any detail not disclosed in embodiments of the device of the present disclosure.

In a device for monitoring a closed state of a cover of an exposure machine provided in embodiments of the present disclosure, the cover is opened or closed using a servo motor coaxially rotating with the cover. An angle of rotation of the shaft of the servo motor is measured using a photoelectric encoder, allowing to detect whether the cover is in the closed state, thereby improving the product yield.

Figure 7:
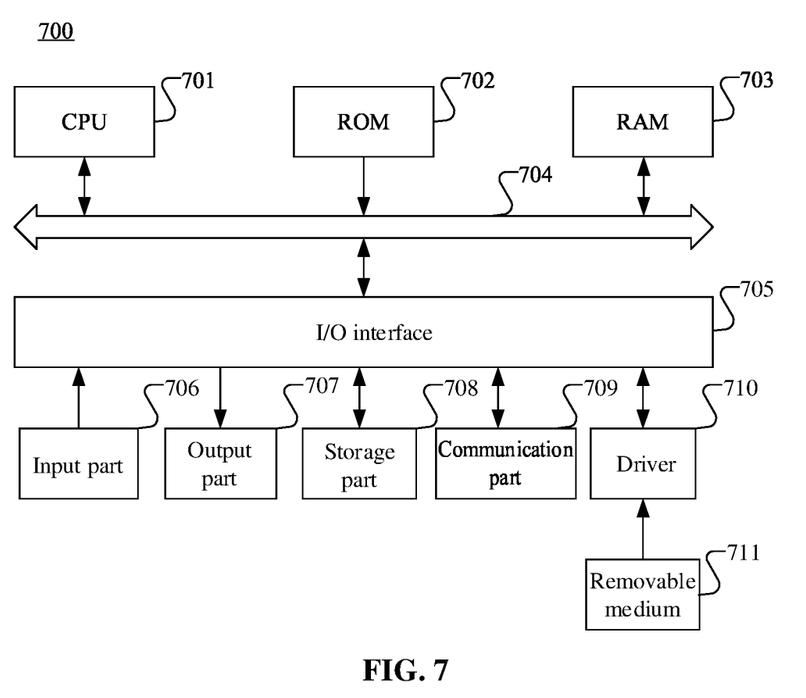
FIG. 7 is a diagram of a structure of a computer system for implementing electronic equipment according to an embodiment of the present disclosure.

FIG. 7 is a diagram of a structure of a computer system 700 for implementing electronic equipment according to an embodiment of the present disclosure. The computer system 700 of the electronic equipment shown in FIG. 7 is just an example and should not form any limitation to the function and scope of application of embodiments of the present disclosure.

As shown in FIG. 7, the computer system 700 may include a Central Processing Unit (CPU) 701. The CPU may perform various appropriate actions and processing according to a program stored in a Read Only Memory (ROM) 702 or a program loaded from a storage part 708 to a Random Access Memory (RAM) 703. Various programs and data needed by system operations may further be stored in the RAM 703. The CPU 701, the ROM 702, and the RAM 703 may be connected to one another through a bus 704. An Input/Output (I/O) interface 705 is also connected to the bus 704.

Components as follows may be connected to the I/O interface 705: an input part 706 including a keyboard, a mouse, etc.; an output part 707 including a Cathode-Ray Tube (CRT), a Liquid Crystal Display (LCD), a speaker, etc.; the storage part 708 including a hard disk, etc.; and a communication part 709 including a network interface card such as a Local Area Network (LAN) card, a modem, etc. The communication part 709 performs communication processing through a network such as the Internet. A driver 710 may also be connected to the I/O interface 705 as needed. A removable medium 711, such as a magnetic disk, an optical disk, a magneto-optical disk, a semiconductor memory, etc., may be installed on the driver 710 as needed, such that a computer program read from the removable medium may be installed in the storage part 708 as needed.

Particularly, a process illustrated here with reference to a flowchart may be implemented as a computer software program according to embodiments of the present disclosure. For example, embodiments of the present disclosure may include a computer program product, including a computer program borne in a computer readable storage medium. The computer program may include a program code configured to implement the method shown in the flowchart. In such an embodiment, the computer program may be downloaded from the network through the communication part 709 and installed, and/or installed from the removable medium 711. When executed by the CPU 701, the computer program implements a function defined in the system of the present disclosure.

It is to be noted that the computer readable storage medium shown in the present disclosure may be a computer readable signal medium or a computer readable storage medium or any combination of the two. The computer readable storage medium may be, but is not limited to, such as an electrical, magnetic, optical, electromagnetic, infrared, or semiconductor system, device, or apparatus, or any combination thereof. More specific examples of the computer readable storage medium may include, but are not limited to, an electrical connector with one or more wires, a portable computer disk, a hard disk, a RAM, a ROM, an Erasable Programmable ROM (EPROM) (or a flash memory), an optical fiber, a portable Compact Disc ROM (CD-ROM), an optical storage device, a magnetic storage device, or any proper combination thereof. In the present disclosure, the computer readable storage medium may be any tangible medium including or storing a program. The program may be used by or together with a command executing system, device, or apparatus. In the present disclosure, a computer readable signal medium may include a data signal in a baseband or propagated as part of a carrier, bearing a computer readable program code. A plurality of forms may be adopted for the propagated data signal, including, but are not limited to, an electromagnetic signal, an optical signal, or any proper combination thereof. The computer readable signal medium may further be any computer readable storage medium other than the computer readable storage medium. The computer readable storage medium may send, propagate, or transmit a program configured to be used by or together with an instruction executing system, device, or apparatus. The program code in the computer readable storage medium may be transmitted with any proper medium, including, but not limited to, radio, an electric wire, an optical cable, Radio Frequency (RF), etc. or any proper combination thereof.

The flowcharts and block diagrams in the drawings illustrate possible implementations of architecture, functionality, and operation of the system, method, and computer program product according to embodiments of the present disclosure. In this regard, each block in the flowcharts or block diagrams may represent a module, a program segment, or a part of a code that includes one or more executable instructions for implementing a specified logic function. It should also be noted that, in some alternative implementations, functions noted in blocks may also occur in an order other than that noted in the drawings. For example, two consecutively shown blocks may in fact be performed substantially in parallel, or sometimes performed in a reverse order, depending upon functionality involved. It will also be noted that, each block in the block diagrams or the flowcharts, and combination of blocks in the block diagrams or the flowcharts, may be implemented using a special purpose hardware-based system for executing a specified function or operation, or using a combination of a special purpose hardware and computer instructions.

A unit described in embodiments of the present disclosure may be implemented as software or hardware. The described unit may also be provided in a processor. The name of such a unit does not form any limit to the unit per se in some cases.

As another aspect, the present disclosure further provides a computer-readable medium. The computer-readable medium may be included in the electronic equipment described in the above embodiments, and may also exist by itself, without being assembled into the electronic equipment. The computer-readable medium bears one or more programs. When the one or more programs are executed by the electronic equipment, the electronic equipment implements the method for monitoring a closed state of a cover of an exposure machine as described in embodiments here.

For example, the electronic equipment may implement, as shown in FIG. 4: S402, where a servo motor control signal is generated to control the servo motor to rotate; S404, where the angle of rotation of the shaft of the servo motor detected by the photoelectric encoder is acquired; and S406, where whether it is determined whether the cover is in the closed state according to the angle.

As another example, the electronic equipment may further implement the various operations shown in FIG. 5A, FIG. 5B and FIG. 5C.

It should be noted that although a number of modules or units of the equipment for executing actions are mentioned in the above detailed description, such a division is not mandatory. As a matter of fact, according to implementation of the present disclosure, features and functions of two or more modules or units described above may be concretized in one module or unit. On the contrary, the feature and function of one module or unit described above may further be divided to be concretized by multiple modules or units.

With description of the above implementation, it is easily understood by a skilled person in the art that the illustrative implementation described here may be implemented by software, and may also be implemented by software combined with necessary hardware. Therefore, a technical solution according to implementation of the present disclosure may be embodied in form of a software product. The software product may be stored in a non-volatile storage medium (which may be a CD-ROM, a U disk, a mobile hard disk, etc.) or on a network, and include a number of instructions enabling computing equipment (which may be a personal computer, a server, a touch terminal, network equipment, etc.) to execute the method according to implementation of the present disclosure.

Other implementations of the present disclosure will be apparent to a person having ordinary skill in the art that has considered the specification and practiced the present disclosure. The present disclosure is intended to cover any variation, use, or adaptation of the present disclosure following the general principles of the present disclosure and including such departures from the present disclosure as come within common knowledge or customary practice in the art. The specification and the embodiments are intended to be illustrative only, with a true scope and spirit of the present disclosure being indicated by the appended claims.

It should be understood that the present disclosure is not limited to the exact construction that has been described above and illustrated in the drawings, and that various modifications and changes can be made to the present disclosure without departing from the scope of the present disclosure. It is intended that the scope of the present disclosure is defined only by the appended claims.

INDUSTRIAL APPLICABILITY

In technical solutions provided in some embodiments of the present disclosure, the cover is opened or closed using a servo motor coaxially rotating with the cover. An angle of rotation of the shaft of the servo motor is measured using a photoelectric encoder, allowing to detect whether the cover is in the closed state, thereby improving the product yield.

The invention claimed is:
1. A system, comprising:
a servo motor, wherein a shaft of the servo motor is coaxially fixedly connected to a shaft of a cover of an exposure machine;
a photoelectric encoder, wherein the photoelectric encoder is provided on the servo motor, and is configured to detect an angle of rotation of the shaft of the servo motor;
a controller, wherein the controller is connected to the servo motor and the photoelectric encoder, and is configured to control rotation of the shaft of the servo motor and determine whether the cover is in a closed state according to the angle;
a sensing plate of a proximity switch, wherein the sensing plate of the proximity switch is provided atop a side of the cover away from the shaft of the cover; and
a sensor of the proximity switch, wherein the sensor of the proximity switch is in signal connection with the controller, is provided atop a side of a cover frame of the exposure machine away from the shaft of the cover corresponding to the sensing plate of the proximity switch, and is configured to, in response to the cover being closed and the sensing plate of the proximity switch approaching the sensor of the proximity switch, generate a proximity signal and send the proximity signal to the controller.

2. The system of claim 1, wherein the proximity switch is an inductive proximity switch, and the sensor of the proximity switch is a sensor of the inductive proximity switch.

3. The system of claim 1, further comprising a metal suction plate and an electromagnet,
wherein the metal suction plate is provided below a side of the cover away from the shaft of the cover,
wherein the electromagnet is in signal connection with the controller, is provided below a side of a cover frame of the exposure machine away from the shaft of the cover corresponding to the metal suction plate, and is configured to engage the metal suction plate according to an electromagnet control signal sent by the controller.

4. The system of claim 3, wherein the metal suction plate and the electromagnet are provided in pairs below the side of the cover away from the shaft of the cover and the side of the cover frame of the exposure machine away from the shaft of the cover.

5. The system of claim 3, wherein the cover is 700 mm in width, an arm of force of the electromagnet is 700 mm, and an arm of force of the servo motor is 5 mm.

6. The system of claim 1, further comprising a human-machine interaction device,
wherein the human-machine interaction device is in signal connection with the controller, and is configured to display an open state of the cover or a closed state of the cover according to a state signal sent by the controller, and to make, through a manual operation, the controller generate a servo motor control signal to control opening or closing of the cover.

7. The system of claim 3, further comprising an electromagnetic relay,
wherein the electromagnetic relay is connected between the controller and the electromagnet, and is configured to control, according to the electromagnet control signal sent by the controller, connection or disconnection of a path where the electromagnetic relay is located.

8. The system of claim 7, wherein the electromagnetic relay has a low-voltage control circuit and a high-voltage working circuit, wherein the low-voltage control circuit is connected to the controller, wherein the high-voltage working circuit is connected to the electromagnet.

9. The system of claim 1, further comprising a sound-light alarm circuit,
wherein the sound-light alarm circuit is connected to the controller, and is configured to, in response to the cover staying in a not-completely-closed state for a preset first period of time, give a sound-light alarm according to an alarm signal generated by the controller, wherein in the not-completely-closed state, a distance between the cover and the cover frame is greater than a first distance preset.

10. A method for monitoring a closed state of a cover of an exposure machine, a shaft of the cover of the exposure machine being coaxially fixedly connected to a shaft of a servo motor, the servo motor being provided with a photoelectric encoder configured to detect an angle of rotation of the shaft of the servo motor, the method comprising:
generating a servo motor control signal to control the servo motor to rotate;
acquiring the angle of rotation of the shaft of the servo motor detected by the photoelectric encoder; and
determining whether the cover is in the closed state according to the angle; and,
wherein a sensor of a proximity switch is provided on a cover frame of the exposure machine, a sensing plate of the proximity switch is provided on the cover corresponding to the sensor of the proximity switch, and the method further comprises:
generating a first control signal to control deceleration of the servo motor in response to a proximity switch signal generated by the sensor of the proximity switch when sensing proximity to the sensing plate of the proximity switch indicating a distance between the cover and the cover frame less than a second distance preset; and
generating a second control signal to control the servo motor to stop working in response to the proximity switch signal generated by the sensor of the proximity switch when sensing proximity to the sensing plate of the proximity switch indicating a distance between the cover and the cover frame equal to 0.

11. The method of claim 10, wherein an electromagnet is provided on the cover frame of the exposure machine, a metal suction plate is provided on the cover corresponding to the electromagnet, and the method further comprises:
generating an electromagnet control signal to control the electromagnet to engage the metal suction plate in response to the proximity switch signal generated by the sensor of the proximity switch when sensing proximity to the sensing plate of the proximity switch indicating a distance between the cover and the cover frame less than a first distance.

12. The method of claim 11, wherein both the first distance and the second distance are 50 mm.

13. The method of claim 10, further comprising:
sending a state signal to a human-machine interaction device to display an open state of the cover or a closed state of the cover; and
collecting a human-machine interaction signal collected by the human-machine interaction device, and generating, according to the human-machine interaction signal, a servo motor control signal to control opening or closing of the cover.

14. The method of claim 10, further comprising:
in response to the cover staying in a not-completely-closed state for a preset first period of time, generating an alarm signal, and sending the alarm signal to a sound-light alarm circuit to give a sound-light alarm, wherein in the not-completely-closed state, a distance between the cover and the cover frame is greater than a first distance preset.

15. The method of claim 14, wherein the first period of time is 2 h, and the first distance is 50 mm or 25 mm.

16. A system, comprising:
a servo motor, wherein a shaft of the servo motor is coaxially fixedly connected to a shaft of a cover of an exposure machine;
a photoelectric encoder, wherein the photoelectric encoder is provided on the servo motor, and is configured to detect an angle of rotation of the shaft of the servo motor;
a controller, wherein the controller is connected to the servo motor and the photoelectric encoder, and is configured to control rotation of the shaft of the servo motor and determine whether the cover is in a closed state according to the angle;
a metal suction plate, wherein the metal suction plate is provided below a side of the cover away from the shaft of the cover; and
an electromagnet, wherein the electromagnet is in signal connection with the controller, is provided below a side of a cover frame of the exposure machine away from the shaft of the cover corresponding to the metal suction plate, and is configured to engage the metal suction plate according to an electromagnet control signal sent by the controller.

17. The system of claim 16, wherein the metal suction plate and the electromagnet are provided in pairs below the side of the cover away from the shaft of the cover and the side of the cover frame of the exposure machine away from the shaft of the cover.

18. The system of claim 16, wherein the cover is 700 mm in width, an arm of force of the electromagnet is 700 mm, and an arm of force of the servo motor is 5 mm.

19. The system of claim 16, further comprising an electromagnetic relay, wherein the electromagnetic relay is connected between the controller and the electromagnet, and is configured to control, according to the electromagnet control signal sent by the controller, connection or disconnection of a path where the electromagnetic relay is located.

20. The system of claim 16, wherein the electromagnetic relay has a low-voltage control circuit and a high-voltage working circuit, wherein the low-voltage control circuit is connected to the controller, wherein the high-voltage working circuit is connected to the electromagnet.

* * * * *